United States Patent [19]

Tang

[11] 4,356,429
[45] Oct. 26, 1982

[54] ORGANIC ELECTROLUMINESCENT CELL

[75] Inventor: Ching W. Tang, Rochester, N.Y.

[73] Assignee: Eastman Kodak Company, Rochester, N.Y.

[21] Appl. No.: 169,705

[22] Filed: Jul. 17, 1980

[51] Int. Cl.³ .......................... H01J 1/62; H01L 29/28; H01L 31/06
[52] U.S. Cl. ..................................... 313/503; 313/504
[58] Field of Search ................ 313/504, 503, 509, 506

[56] References Cited

U.S. PATENT DOCUMENTS

| | | | |
|---|---|---|---|
| 3,172,862 | 3/1965 | Gurnee et al. | 313/503 |
| 3,173,050 | 3/1965 | Gurnee | 313/504 |
| 3,227,656 | 1/1966 | Jeffreys | 252/301.2 |
| 3,530,325 | 9/1970 | Mehl et al. | 313/504 |
| 3,621,321 | 11/1971 | Williams et al. | 313/504 |
| 3,995,299 | 11/1976 | Partridge | 313/498 X |
| 4,164,431 | 8/1979 | Tang | 357/8 X |

FOREIGN PATENT DOCUMENTS 590352 1/1960 Canada .

OTHER PUBLICATIONS

Research Disclosure; Oct. 1977; pp. 71–73.

Primary Examiner—Robert Segal
Attorney, Agent, or Firm—Dana M. Schmidt

[57] ABSTRACT

An organic electroluminescent cell is disclosed comprising a luminescent zone between two electrodes, wherein a hole-injecting zone comprising a porphyrinic compound is disposed between the luminescent zone and the anode electrode.

5 Claims, 1 Drawing Figure

ORGANIC ELECTROLUMINESCENT CELL

FIELD OF THE INVENTION

This invention relates to organic electroluminescent cells, that is, devices that generate light in response to an electrical signal and are constructed using organic compounds as the light-generating means.

BACKGROUND OF THE INVENTION

Organic electroluminescent cells have been constructed from a laminate of an organic luminescent agent and electrodes of opposite polarity, one of the electrodes serving as an electron injector and the other as a hole injector. Such cells have included single crystal materials, such as single crystal anthracene, as a luminescent agent as described for example in U.S. Pat. No. 3,530,325. However, single crystals present the disadvantages that (a) they are expensive to manufacture and (b) they cannot easily be reduced in thickness below 50 microns, hereinafter "$\mu$". It is important that thin film devices be obtainable, as cells of thicknesses much larger than $1\mu$ frequently require excitation voltages on the order of 100 volts or greater for light output of about 1 ft-lambert or more.

Attempts to obtain a coating of luminescent agents such as anthracene at 1 micron or less have resulted in the formation of pinholes. These pinholes act as shorts between the electrodes, and no luminescence is produced. Although non-conductive polymeric binders can be added, usually as solid solvents, to provide pinhole free film, and to create a luminescent zone of the desired thickness, the binders tend to interfere with the injection of holes and electrons at the electrodes. To prevent the shorting, the binders preferably are polymeric insulators and have a breakdown field strength of at least about $10^5$ volt/cm. However, such insulating binders necessarily tend to resist hole injection and/or electron injection from the metallic electrodes. Workers in the art have, accordingly, been avoiding the problem by using cell thicknesses that are greater than are otherwise desired. Because greater thicknesses require greater excitation voltages for a given light output, the efficiencies are reduced.

SUMMARY OF THE INVENTION

In accordance with the present invention there is advantageously featured an electroluminescent cell that is highly efficient.

It is a related feature of the cell of the invention that it is highly luminescent at low power conditions, e.g., at voltages no greater than about 20 volts, current densities no greater than about 1 amp/cm$^2$, and at room temperature.

The aforesaid features of the invention are achieved by means of an improved cell including an anode electrode, a cathode electrode, and a luminescent zone between the electrodes, the luminescent zone comprising an organic luminescent agent and a binder having a breakdown field strength of at least about $10^5$ volt/cm. The improvement resides in the use of a hole-injecting zone comprising a layer of a porphyrinic compound between the luminescent zone and the anode electrode.

Other features of the invention will become apparent upon reference to the following Description of the Preferred Embodiments when read in light of the attached drawing.

BRIEF DESCRIPTION OF THE DRAWING the drawing is a partially schematic section view of a cell of the invention connected to a power source.

DESCRIPTION OF THE PREFERRED EMBODIMENTS

Figure 1:
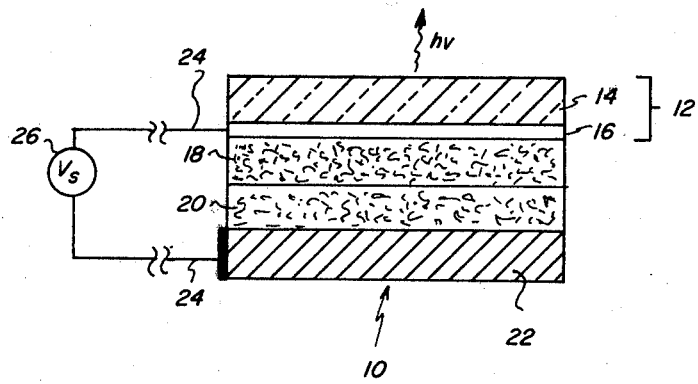

This invention is used to advantage to provide an electroluminescent cell requiring a relatively low voltage. This in turn is due to the very thin nature of the luminescent zone. The thin zone is feasible partly because a binder is incorporated with the luminescent agent of the luminescent zone. Preferably the zone's thickness does not exceed about 1 micron, measured in the direction of current flow through the zone.

In addition, the invention can be used with any luminescent zone provided with a non-conductive binder, even those whose thicknesses are significantly larger than 1 micron.

The invention derives from the discovery that the current inhibiting effect of the binder is overcome by placing a particular hole-injecting zone between the luminescent zone containing the binder, and the anode electrode. As a result, neither of the electrodes need be especially reactive. Specifically, porphyrinic compounds have been found to provide hole-injection sufficient to overcome the resistance of the binder, even when conventional materials are used as the anode and cathode electrodes.

The luminescence is generated primarily by the luminescent agent. As used herein, the luminescent agent is any material that radiates light due to the decay of an excited state created by the recombination of electron-hole pairs. Preferably, the material has a total emission quantum yield of at least about 0.1%.

Any organic luminescent agent is useful in the luminescent zone of the cell of the invention. Advantageously, the luminescent agent is one that relies upon the presence of a binder to prevent pinholing. Most preferred examples of useful luminescent agents include aromatic compounds such as anthracene, naphthalene, phenanthrene, pyrene, chrysene and perylene; butadienes such as 1,4-diphenylbutadiene and tetraphenylbutadiene; coumarins; acridine; stilbenes such as trans-stilbene; and any other luminescent agent having a fused ring structure of less than 8 rings.

A wide variety of binders is useful with the luminescent agent to prevent pinholing, provided they have a sufficient breakdown field strength as noted above and sufficient film-forming characteristics. Although preferred are polymeric binders that act as solid solvents, other binders are useful in admixture with the luminescent agent, e.g., as described in U.S. Pat. No. 3,621,321.

Of the solvent binders, the following are representative polymers found to be highly useful: addition polymers such as polystyrene or poly(p-t-butylstyrene) having a breakdown field strength of about $2 \times 10^6$ volt/cm, poly(vinyl carbazole), poly(vinyltoluene), poly(methyl methacrylate), poly(acrylonitrile) copolymers and poly(vinyl acetate); and condensation polymers such as polyesters, polycarbonates, polyimides and polysulfones.

any form of luminescent zone is useful in the cell. Preferred is a layer format, the other zones and materials of the cell being formed also as layers in a laminate.

As is conventional, the anode electrode is preferably a transparent insulative layer coated with a layer of at least partially transparent conductive material, e.g., tin oxide, indium oxide and indium tin oxide. Thus, the light emitted by the luminescent zone is transmitted through the anode. Alternatively, the anode is opaque, provided that if the cathode is also opaque then the luminescent zone is itself transparent at its edges. In yet another embodiment, a semitransparent cathode is used, the light being viewed through such cathode.

Preferred examples of anodes include glass coated with a semitransparent layer of indium tin oxide, tin oxide or nickel, e.g., coated glass available under trademarks Nesa TM and Nesatron TM from PPG Industries having a sheet resistance of about 10 to 50 ohms/square and an optical transmittance of about 80 percent for visible light.

In accordance with one aspect of the invention, a hole-injecting zone is disposed between the luminescent zone and the anode, the hole-injecting zone comprising a porphyrinic compound. As used herein, a porphyrinic compound is any compound, natural or synthetic which derives from or includes the basic porphyrin structure, including porphyrin itself. Examples of such are disclosed in the U.S. Pat. No. 3,935,031, the details of which are expressly incorporated herein by reference. A currently preferred class of such compounds is the class having the structure

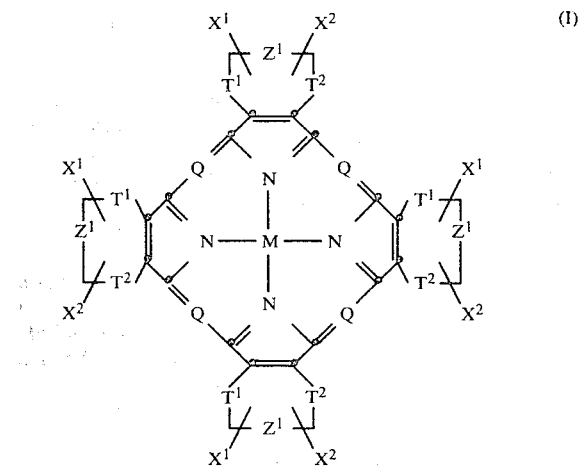

wherein:
Q is -N= or =CH-;
M is a metal;
$T^1$ and $T^2$ are both S or both C, or one of $T^1$ and $T^2$ is N and the other is C;
$X^1$ and $X^2$ are the same or different, and are each hydrogen or halogen, such as chlorine, fluorine and bromine; and
$Z^1$ represents the atoms necessary to form a six-membered unsaturated ring.

A further option is to modify the compounds of structure (I), to provide a non-metallic complex wherein two of the four nitrogens are hydrogenated.

Highly preferred examples of useful porphyrins are metal-free phthalocyanines and the metal phthalocyanines wherein M of structure (I) is any metal such as cobalt, magnesium, zinc, palladium, nickel, and particularly copper, lead, or platinum.

Useful cathode electrodes include those formed from common metals with a low-work function, such as indium, silver, tin, aluminum or the like, whether semitransparent or opaque. Importantly, the cathode need not be selected from highly reactive alkali metals which require protection against accidental oxidation.

The Figure illustrates an electroluminescent cell 10 prepared in accordance with the invention. It comprises an anode electrode 12 formed as a layer of glass 14 coated with a semitransparent coating 16 of indium tin oxide, on which is deposited a layer 18 of a porphyrinic compound. A layer 20 of a luminescent agent and a binder is deposited on layer 18, over which is deposited a cathode electrode 22. Lead lines 24 are connected to a voltage source ($V_s$) 26 in a conventinal manner. Source 26 is a D.C. or A.C. source, and preferably includes conventional circuitry that delivers a step or pulsed signal. For example, the cell of the invention provides a fast-time response of about 1 to 10 microseconds to a pulsed signal.

Alternatively, the cell of the invention can include a second luminescent agent in the luminescent zone, preferably as a second layer, not shown, between the cathode electrode and the layer containing the binder and the first luminescent agent, to cause a shifting of the emitted light to other wavelengths. Preferably such second luminescent agent is organic and is different from the luminescent agent provided with the binder.

Alternatively, both luminescent agents can be admixed in one layer if they are both soluble in the binder.

In yet another alternate embodiment of the invention, the zones of the cell are arranged side-by-side as parts of a single layer on an insulative substrate. In such an embodiment, the two electrodes constitute the two opposite end portions of the layer. To prevent the voltage load from being excessive, the width of the luminescent zone measured from the hole-injecting zone to the cathode preferably would be as described above, that is no larger than about 1 micron.

Such a cell constructed from the materials described above has been found to produce luminescence with markedly superior efficiencies. That is, a source 26 with a voltage no greater than 20 volts and a room temperature current density of no more than 1 amp/cm² produces in cell 10 a luminosity of at least 0.5 ft-lamberts.

Any suitable coating technique is useful to manufacture the afore-described cell. For example, one preferred coating technique features coating the layers from different solvents, one upon the other, the solvent of one layer being a poor solvent for the other. The currently preferred method is to vapor deposit the porphyrinic layer on a clean, i.e., polished, anode electrode, using sources of porphyrinic compounds which are reasonably free of decomposable or volatile materials, and thereafter solvent coat the luminescent layer as by spin coating at between about 1,000 and about 10,000 rpm from one or more of the following solvents: 1,2-dichloroethane, dichloromethane, and mixtures of the two, toluene, xylene, and tetrahydrofuran. Another useful method is to deposit the luminescent and hole-injecting zones by vapor deposition. The cathode electrode also can be applied by conventional vapor deposition.

A currently preferred process for polishing the Nesatron TM glass, if used as the anode electrode, comprises rubbing the Nesatron TM surface with a cotton flannel wetted with a suspension of an alumina or other abrasive, usually for a few minutes. The polished Nesatron TM glass is then sonicated in a 1:1 $H_2O$/isopropyl alcohol bath for about half an hour to remove the abrasive particles, and then rinsed thoroughly with distilled water. The polished Nesatron ™ glass appears relatively clean in a strong light.

EXAMPLES

The following examples further illustrate the nature of the invention.

EXAMPLE 1

A cell was prepared as a laminate of Nesatron and copper phthalocyanine, hereinafter, CuPc, at a thickness of about 1000 Å. A layer of tetraphenylbutadiene in polystyrene was applied over the CuPc, also at about 1000 Å. Finally, a layer of Ag was applied, as follows: (1) the CuPc thin film was deposited on the cleaned Nesatron by vacuum deposition. (2) Tetraphenylbutadiene in polystyrene (weight ratio 1:4) was cast on top of the CuPc by spin coating at a speed of 10,000 rpm. The solution used for this spin coating contained 25 mg solids dissolved in 1 mL toluene. The thickness of the resulting film was about 1000 Å. (3) A Ag electrode was applied on top of the tetraphenylbutadiene/polystyrene film by vapor deposition in vacuum.

The two-layer cell gave blue light when it was excited by 20 V, and an average current density of 30–40 mA/cm$^2$. The brightness of the cell was about 1.5 ft-lambert and the peak emission was at 467 nm.

By contrast, the same cell without the CuPc layer, namely Nesatron/(tetraphenylbutadiene/polystyrene) (~1000–2000 Å)/Ag, either did not emit light at a 20 V bias, or the cell suffered from electrical arcing at 20 V or higher voltages with some weak white light emission at localized spots, indicating a breakdown phenomenon.

EXAMPLE 2

A cell was constructed as Nesatron/CuPc/(tetraphenylbutadiene/polystyrene)/PV-H/Ag, where PV-H is

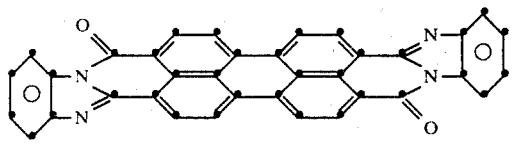

The preparation of CuPc/tetraphenylbutadiene film on Nesatron was as described in Example 1. PV-H (~500–1000 Å) was evaporated on top of the tetraphenylbutadiene/polystyrene film. The light emitted by this cell was now almost completely shifted to the near infrared at 810 nm, which was attributed to the emission of the PV-H film.

EXAMPLE 3

A cell was prepared comprising a first layer (~1000 Å) of CuPc and a second layer (~1000 Å) of tetraphenylbutadiene in a poly(p-t-butylstyrene) polymer binder (weight ratio 1:4). The two layers were sandwiched between a Nesatron ™ anode electrode (adjacent to the CuPc layer) and an evaporated silver electrode. Upon excitation by a DC voltage source of 28 volts and 6 mA/cm$^2$, a blue emission of brightness of about 6 ft-lambert was observed.

EXAMPLE 4

A cell of a configuration similar to Example 3 was prepared except that the polymer binder was a bisphenol-A polycarbonate. Upon excitation by a DC voltage source of 36 volts and about 25 mA/cm$^2$, a blue emission of about 2 ft-lambert was observed.

EXAMPLE 5

A cell of a configuration similar to Example 3 was prepared except that the polymer binder was poly(vinyltoluene). Upon excitation by a DC voltage source of 30 volts and 100 mA/cm$^2$, a blue emission of 50 ft-lambert was observed.

EXAMPLE 6

A cell of a configuration similar to Example 3 was prepared except that the polymer binder was poly(acrylonitrile-co-styrene). Upon excitation by a DC voltage source of 30 volts and 10 mA/cm$^2$ a blue emission of brightness about 2.5 ft-lambert was observed.

EXAMPLE 7

A cell of configuration similar to that of Example 3 was prepared except that the luminescent layer was tetraphenylethylene/polystyrene (weight ratio 1:4). Upon excitation by a DC voltage source of 26 volts and 180 mA/cm$^2$, a blue-green emission of brightness of about 18 ft-lambert was observed.

EXAMPLE 8

A cell of configuration similar to that of Example 3 was prepared except that the phthalocyanine layer was metal-free phthalocyanine (~1208 Å) and the luminescent layer was ~1000 Å of 7-diethylamino-4-methylcoumarin in a polystyrene matrix (weight ratio 1:6). Upon excitation by a pulsed voltage of 40 volts, 10% duty cycle and peak current density of about 10 mA/cm$^2$, a purple-blue emission of brightness about 3 ft-lambert was observed.

The invention has been described in detail with particular reference to preferred embodiments thereof, but it will be understood that variations and modifications can be effected within the spirit and scope of the invention.

What is claimed is:

1. In an electroluminescent cell including an anode electrode, a cathode electrode, and a luminescent zone between said electrodes comprising an organic luminescent agent and a binder having a breakdown field strength of at least about 10$^5$ volt/cm, the improvement comprising, between said luminescent zone and said anode electrode, a hole-injecting zone comprising a layer of a porphyrinic compound.

2. A cell as defined in claim 1, wherein said porphyrinic compound is a phthalocyanine.

3. A cell as defined in claim 1, wherein said porphyrinic compound is a metal phthalocyanine.

4. A cell as defined in claim 1, 2 or 3, wherein said binder is a polymeric solvent for said luminescent agent.

5. A cell as defined in claim 1, wherein said luminescent zone includes a second luminescent agent different from said organic luminescent agent, said second agent being capable of shifting the wavelength of the light emission from that of the first luminescent agent.

* * * * *